United States Patent [19]

Miller et al.

[11] Patent Number: 5,433,821
[45] Date of Patent: Jul. 18, 1995

[54] DIRECT PATTERNIZATION DEVICE AND METHOD

[75] Inventors: Thomas L. Miller, Vestal, N.Y.; Richard C. Taylor, Warren Center, Pa.; Michael R. Gaige, Kirkwood, N.Y.

[73] Assignee: International Business Machines Corporation, Armonk, N.Y.

[21] Appl. No.: 201,852

[22] Filed: Feb. 25, 1994

[51] Int. Cl.6 .............. B44C 1/22; C23F 1/02
[52] U.S. Cl. ...................... 216/18; 156/345; 216/90
[58] Field of Search ............ 156/640, 656, 659.1, 156/664, 666, 901, 902, 345

[56] References Cited

U.S. PATENT DOCUMENTS

| | | | |
|---|---|---|---|
| 2,905,539 | 9/1959 | Bowerman | 156/901 X |
| 3,616,049 | 10/1971 | Moore et al. | 156/640 X |
| 4,359,360 | 11/1982 | Harris et al. | 156/345 |
| 4,447,917 | 5/1984 | Walter | 4/256 |
| 4,600,463 | 7/1986 | Aigo | 156/345 |
| 5,074,132 | 12/1991 | Koller | 68/205 R |
| 5,252,179 | 10/1993 | Ellerson et al. | 156/655 |

*Primary Examiner*—William Powell
*Attorney, Agent, or Firm*—Calfee, Halter & Griswold

[57] ABSTRACT

A predetermined electrical circuit pattern or discrete features composed of discrete, electrically conducting metal pathways and non-conducting spaces therebetween is formed on a dielectric substrate by (1) depositing a continuous layer of an electrically conducting metal on a surface of the substrate, (2) contacting the metal layer with a mask head defining a system of ridges and valleys therein, the ridges corresponding to the pathways of the target electrical circuitry pattern or discrete features and the valleys corresponding to the spaces of the target pattern, the ridges in the mask head contacting the metal layer in sealing arrangement with the portions of the metal layer coming into contact with the ridges, and (3) contacting the metal layer with an etchant to remove the portions of the metal layer in the spaces and thereby form the target electrical circuitry or discrete features pattern.

25 Claims, 1 Drawing Sheet

DIRECT PATTERNIZATION DEVICE AND METHOD

BACKGROUND OF THE INVENTION

The present invention relates to an improved technique for forming predetermined electrical circuitry patterns on dielectric substrates, particularly ceramic substrates.

Circuit "boards" or "cards" carrying a vast array of different electronic components are widely used in many different types of electrical devices such as computers and the like. One type of electronic component typically carried on a circuit board is a "module" comprising a ceramic substrate carrying one or more "chips" or other electrical devices. The ceramic substrates of such modules typically carry on one or both major surfaces thereof electrical circuitry patterns for electrical contact with the chips and discrete features for other elements mounted thereon. In the industry, it is typical to refer to modules comprising ceramic substrates having one or more chips thereon as "first level packages" and to refer to the circuit boards or cards on which the first level packages or modules are mounted as "second level packages."

The electrical circuitry patterns carried on the ceramic substrates of conventional first level packages or modules typically are composed of discrete, electrically conducting metal pathways and non-conducting spaces therebetween. In manufacture, they are formed by a complicated procedure which involves a "first pass" or "personalization" for forming the predetermined electrical circuitry pattern usually by photoresist process and a "second pass" or "select pass" for treating selected portions of the metal pathways formed in the first pass to promote solder adhesion thereto.

For example, in a typical photoresist process for this purpose, the first pass usually involves depositing a continuous metal layer on the ceramic substrate, forming an adherent photoresist mask on the metal layer defining a pattern of openings corresponding to the non-conducting spaces in the target electrical circuitry pattern, etching to remove the metal exposed by these openings and finally removing the resist to thereby produce the first pass product. In the second pass, a procedure essentially identical to the first pass process is used, except that the pattern of the photoresist is changed so that only the portions of the metal pathways which are to be treated for solder adhesion are exposed. In addition, the chemicals are changed so that etching merely promotes solder adhesion rather than completely removes the metal.

Photoresist technology for producing predetermined electrical circuitry patterns on dielectric substrates, such as ceramic substrates, has developed to the point where extremely high "circuit densities" can be produced. For example, processes available today can produce electrical circuitry patterns whose metal pathways are as thin as one mil (0.001") and whose non-conducting spaces therebetween are as thin as two mils (0.002").

Although many applications require the production of electrical circuitry patterns or discrete features with very high circuit densities (i.e., very thin metal pathways and very thin non-conducting spaces therebetween), many other applications do not. For example, in many applications, circuit densities having metal pathway widths on the order of 3 to 4 mils or more and space widths of 4 to 5 mils or more are entirely acceptable.

Typical photoresist processes, as described above, are relatively expensive to carry out. This is because they involve many process steps and typically employ many different chemicals, some of which are environmentally dangerous. Accordingly, there is a need for a technique for producing electrical circuitry patterns on dielectric substrates, particularly ceramic substrates, which is less complicated and preferably uses fewer chemicals than prior art processes. Such a technique would be particularly advantageous in those applications in which the high circuit densities made possible by modern photoresist technologies were unnecessary.

Accordingly, it is an object of the present invention to provide a new technique for forming electrical circuitry patterns and discrete features on dielectric substrates, particularly ceramic substrates, which is less complicated, less expensive and uses fewer chemicals than conventional photoresist processes practiced currently.

SUMMARY OF THE INVENTION

This and other objects are accomplished by the present invention in accordance with which a predetermined electrical circuit pattern or discrete features composed of discrete, electrically conducting metal pathways and non-conducting spaces therebetween is formed on a dielectric substrate by (1) depositing a continuous layer of an electrically conducting metal on a surface of the substrate, (2) contacting the metal layer with a mask head defining a system of ridges and valleys therein, the ridges in the mask head sealing the portions of the metal layer corresponding to the pathways in the target circuitry pattern from liquid contact, the valleys in the mask head exposing the portions of the metal layer corresponding to the spaces in the target pattern, and (3) with the mask head remaining in this sealing contact, contacting the portions of the metal layer exposed by said valleys with an etchant to remove these exposed portions and thereby form the target electrical circuitry pattern.

BRIEF DESCRIPTION OF THE DRAWINGS

The present invention is more thoroughly illustrated in the following drawings wherein.

DETAILED DESCRIPTION

Figure 1:
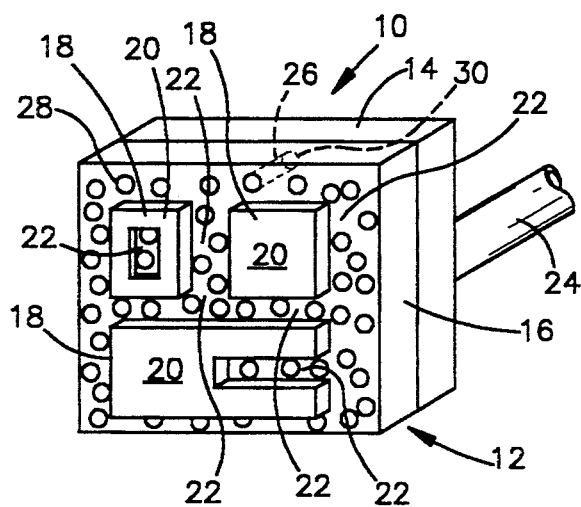
FIG. 1 is a perspective view illustrating a mask head used in accordance with the present invention for forming electrical circuitry patterns on dielectric substrates.

In accordance with the present invention, a predetermined electrical circuitry pattern or discrete feature is formed on a dielectric substrate, preferably a ceramic substrate, by first depositing a continuous layer of an electrically conductive metal on a surface of the substrate and thereafter selectively removing certain portions of this continuous layer by (a) contacting the metal layer with a mask head defining a system of ridges and valleys corresponding to the predetermined electrical circuitry pattern and (b) while keeping the mask head in place, contacting the metal layer with an etchant to remove those portions of the metal layer not protected by the ridges of the mask head.

In accordance with the invention, the ridges of the mask head are made from a material which will seal those portions of the continuous metal layer intended to form the metal pathways of the completed circuitry pattern. As a result, when the etchant is applied, it attacks and dissolves only those portions of the continuous metal layer which are unprotected.

The simple mechanical step of bringing the mask head into contact with the continuous metal layer on the substrate and leaving the mask in this position during the etchant removal step is far simpler to carry out than prior art techniques using photoresists, since the many steps involved in forming the resist layer, e.g., applying a resist layer, setting the layer as by curing to form a solid resist layer, exposing the solid resist layer to light in a predetermined pattern, developing the exposed resist layer by treatment with suitable chemicals, rinsing and then baking, are eliminated. This not only makes the inventive process far simpler to carry out than prior art techniques using photoresist, but also eliminates the many deleterious chemicals involved in forming, developing and cleaning the photoresist layer.

The present invention is primarily intended for forming predetermined electrical circuitry patterns or discrete features on ceramic substrates in the manufacture of first level packages or modules. Typically, these substrates are thin, essentially flat, ceramic blanks made from aluminum oxide ($Al_2O_3$) or other ceramics, are square or other shape and have maximum dimensions on the order of ½ to 5 inches. The inventive process can, however, be practiced on other substrates such as those used, for example, to form circuit boards or cards in the manufacture of second level packages.

The first step in forming a predetermined electrical pattern or feature on such a substrate using the present invention is to deposit a metal layer on the dielectric substrate. In prior art processes, this is typically done by applying one or more continuous metal layers to the dielectric substrate by conventional coating techniques such as sputtering and the like.

For example, in accordance with one such technique, a layer of chromium approximately 800 Angstroms thick is first applied by sputtering for adhesion-promotion purposes. Next, a layer of copper on the order of 80 kilo Angstroms thick is applied by sputtering to serve as the main body of the electrically conducting metal pathway to be formed. Thereafter, another layer is typically applied to protect the copper layer from oxidation and also to act as a solder dam. For example, a second layer of chromium also about 800 Angstroms thick can be applied by sputtering for this purpose. Also, thin layers of glass or other known materials can also be applied for this purpose. In accordance with another well known technique for depositing a metal layer on the dielectric substrate, a continuous copper or other metal layer is applied by laminating techniques. Typically, metal layers formed in this manner are on the order of 1 to 2 mils in thickness.

In accordance with the present invention, these or any other conventional technique can be employed to form a continuous metal layer on the dielectric substrate for further processing. Moreover, this layer may be formed of any metal or other material conventionally used for this purpose and can be of any conventional thickness.

In the next step according to invention, the continuous metal layer on the dielectric substrate is contacted with a mask head for segregating those portions of the continuous metal layer which are to be retained from those portions which are to be removed. In accordance with the present invention, this mask head contains a system of ridges and valleys, the ridges corresponding to the metal pathways in the predetermined electrical pattern or features to be formed and the valleys corresponding to the non-conducting spaces therebetween. When the mask head is brought into contact with the continuous metal layer, the ridges contact the metal layer in such a way that the portions of the metal layer thereunder are sealed from contact by the liquid etchant to be subsequently applied. At the same time, the portions of the metal layer which are to be subsequently removed by the liquid etchant remain exposed since they face the valleys of the mask head. This enables the portions of the metal layer protected by the ridges to remain intact when the areas exposed by the valleys are dissolved away in the subsequent etching step.

Once the mask head is brought into contact with the metal layer on the dielectric substrate, and with the mask head remaining in this position in such a way that the portions of the metal layer in contact with the ridges of the mask head are sealed from contact with the liquid etchant to be subsequently applied, a metal etchant is charged into the valleys between these ridges to dissolve the portions of the continuous metal layer exposed therein.

Processes for dissolving different metal layers used in forming electrical circuitry patterns or features on dielectric substrates are well known. For example, when the metal layer is formed from a chromium/copper/chromium combination as described above, etching can be done in the following matter. The outer protective chromium layer is first removed using aqueous potassium permaganate, followed by a rinse with aqueous oxalic acid and then a rinse with water. Next, the metallic copper layer can be removed using an etchant comprising aqueous ferric chloride or cupric chloride followed by an aqueous rinse. Finally, the adhesion-promoting chromium layer can be removed in the same way as the previous chromium layer. This technique or any other technique which will function to remove the portions of the metallic layer unprotected by the mask head preferably without deleteriously affecting either the mask or the substrate can be employed.

Once the portions of the continuous metal layer defining the non-conducting spaces in the predetermined electrical pattern or features have been removed, the mask head can then be withdrawn from contact with the dielectric substrate to thereby produce a first pass product having the predetermined electrical circuitry pattern thereon. If desired, one or more additional rinsing steps can also be employed to wash away any residual chemicals that might still be present.

In order to ready the first pass product to accept solder and the like, a second pass operation can be carried out. If desired, this can be done using conventional photoresist techniques as used in prior art processes. Preferably, however, this operation is done using a mask head technique in the same way as described above in connection with the first pass operation. However, in this instance, a different mask head is employed, this mask head having valleys only in the particular areas where the metal pathways are to be prepared for accepting solder. Also, the etchant used in this operation is selected merely to prepare the exposed portions of the metal pathways for receiving solder, not for total removal. For example, in the case where the metal pathways are formed from the chromium/copper/chromium system described above, etching is done to remove the chromium outer layer only, for example, by using the same chromium etch as described above. This will expose the copper thereunder for subsequent electrical contact with solder or other connecting device, thereby producing the completed second pass product.

In accordance with the present invention, it is possible using a mask head in the manner described above, to produce circuit patterns or features having circuit densities in which the widths of the metal pathways are as small as 3 to 4 mils and the widths of the corresponding non-conducting spaces therebetween are as small as 4 to 5 mils. This is made possible in accordance with the present invention by forming the ridges, or at least the portions of the ridges coming into contact with the metal layer, from a flexible material having a durometer hardness of about 40A to 90A. In accordance with the invention, it has been found that materials having a durometer hardness above about 90A are too hard to seal properly, while materials having durometer hardnesses lower than about 40A deform too easily and thereby distort the shape of the electrically conducting metal pathways ultimately produced. Within a durometer hardness range of about 40A to 90A, however, these disadvantages can be largely avoided.

The precise durometer hardness to select for a particular application depends on many variables and can be determined by routine experimentation. For example, the most appropriate durometer hardness is a function of the flatness of the substrate and its metal layer and also of the circuit density of the electrical circuit to be formed. Substrates which are less smooth generally require softer materials, while electrical patterns having higher circuit densities generally require harder materials. In many applications, durometer hardnesses closer to the middle of this range, for example 50A to 60A, are preferred.

Although any material can be used to form these ridges, they are preferably made from sections of synthetic rubber, preferably EPDM rubber. Another suitable material is moldable polyurethane, since this material is also moldable, chemically resistant and capable of being made with different hardnesses as desired. Incidentally, it should be appreciated that a major factor in determining the minimum widths for the metal pathways in the circuit patterns produced by the present invention is the ability of current technology to form the ridges in sufficiently narrow shape. As technology for forming the ridges improves, circuit patterns with even higher circuit densities should be obtainable.

Another significant factor in accordance with the present invention is the force or pressure with which the mask head is brought into contact with the substrate. Obviously, the pressure cannot be so great as to deform the ridges out of shape or to break or otherwise physically degrade the substrate or its metal coating. In addition, the force cannot be so small that sealing of the ridges of the mask head with the metal layer will be lost. Basically, the amount of force necessary is that which is enough to overcome the opposing force of the etchant or other fluid being processed and in addition to cause the ridges of the mask head to form seals with clean, crisp edges with the metal layer thereunder. This can easily be determined by routine experimentation.

In this regard, one of the preferred materials for use in forming ridges of the mask head in accordance with the present invention, EPDM rubber, exhibits suitable sealing properties if compressed with a pressure acting in its sealing surface of 2 to 20 lbs. per square inch, preferably 5 to 15 lbs. per square inch, with pressures on the order of 10 lbs. per square inch being especially preferred. Accordingly, when using a mask head made from this material, it would be advisable to use a force for the mask head which, in addition to overcoming the fluid pressure of the etchant, exerted about this much pressure on the ridges themselves. A good approximation of this force could be determined by calculation, since the pressure of the fluid and the areas of the ridges and valleys are already known, with routine experimentation being used to check or confirm the results so calculated.

In accordance with another feature of the present invention, a novel design for the mask head employed in the inventive process is provided. An example of such a mask head is schematically illustrated in FIG. 1 in which the inventive mask head is generally indicated at 10. Mask head 10 is formed from a body generally indicated at 12, which in turn is composed of a manifold 14, a backing plate 16 and sections 18. In the illustrated embodiment, sections 18 are composed of EPDM rubber 0.010 to 0.25, preferably 0.030 to 0.100 inches thick, while backing plate 16 is formed from a 0.010 to 0.250 inch thick sheet of titanium metal or stainless steel, preferably titanium metal.

In the embodiment shown, flat outer surfaces of rubber sections 18 of mask head 10 define ridges 20, while the open areas between the different rubber sections 18 together with backing plate 16 form valleys 22. In accordance with the invention, ridges 20 correspond with the electrically conducting metal pathways in the predetermined electrical circuitry pattern to be formed on the dielectric substrate, while valleys 22 correspond with the non-conducting spaces therebetween.

Supply conduit 24 is provided to supply the various chemicals employed in the etching operation, to the cavity (not shown) in manifold 14, while a series of etchant conduits 26 having first ends 28 communicating with valleys 22 and second ends 30 communicating with the cavity in the manifold are provided for transferring these chemicals from the manifold to valleys 22. With this structure, etchant and other chemicals charged into supply conduit 24 travel into manifold 14 and then through etchant conduits 26 into valleys 22 where they dissolve the portions of the metal facing these valleys during the etching operation. In the embodiment shown, the diameters of etchant conduits 26 are 0.010 to 0.250, preferably 0.020 to 0.050 inches.

As illustrated in FIG. 1, the inventive mask head can be used to produce circuitry patterns or features having many different designs. Depending on exactly how these designs are shaped, the valleys 22 in the mask head may be totally open to the periphery of the substrate being processed, partially open or not open at all. For example, as shown in FIG. 1, the valleys 22 surrounding the box-shaped section 18 in the upper right-hand portion of the Figure are totally open to the periphery of the mask head. On the other hand, the notch-shaped valley in the lower section 18 of FIG. 1 is closed on three sides and is open only on one side to the periphery of the mask head. In addition, the valley in the section 18 in the upper left-hand side of FIG. 1 is wholly contained within this section and is therefore totally closed to the periphery of the mask head. In accordance with another feature of the invention, the size, shape and arrangement of the individual etchant conduits are controlled so as to facilitate dissolution of the portions of the metal layer to be removed during the etching step.

In this regard, it is desirable in carrying out the present invention that the flow of etchant and other fluids in the valleys formed by the inventive mask head be as nearly uniform as possible. Otherwise, metal removal during etching and other treatment processes will occur in a non-uniform manner. Therefore, in accordance with one feature of the invention, the size, location and arrangement of the individual conduits is selected so as to facilitate uniform etchant flow.

Figure 2:
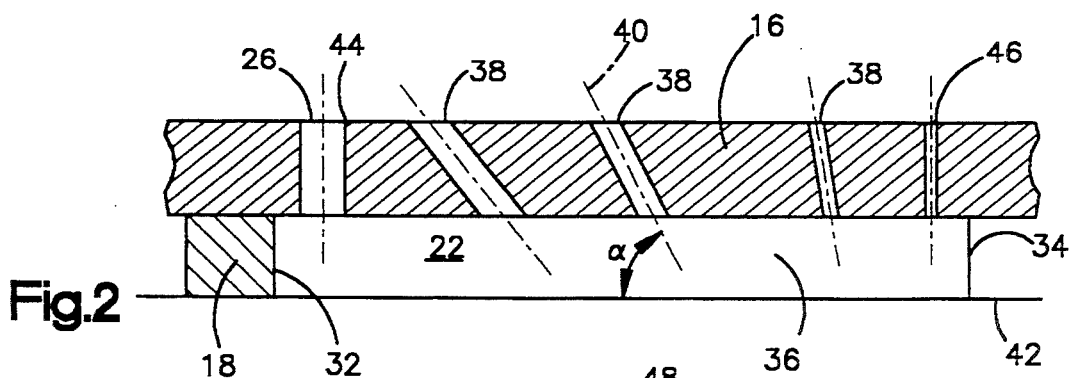
FIG. 2 is a schematic representation, partly in cross-section, showing a portion of the mask head of the present invention illustrating the arrangement of etchant conduits when a valley in the mask head is open on one side to the periphery of the dielectric substrate.
Figure 3:
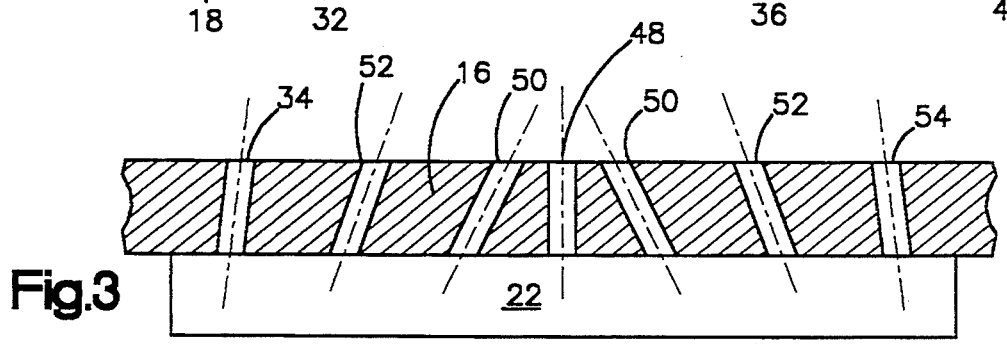
FIG. 3 is a view similar to FIG. 2 showing another arrangement of etchant conduits especially suitable for a mask head in which the valley is open on both of its ends to the periphery of the substrate.

This feature of the invention is illustrated in FIGS. 2 and 3 which show different sizes and arrangements of etchant conduits being used for supplying valleys of different shapes. For example, in FIG. 2, which is a cross-sectional side view, the valley 22 is essentially horse-shoe shaped in configuration and includes a closed end 32, an open end 34 and a side surface 36 connecting the closed and open ends.

In accordance with the invention, a series of etchant conduits 26 are provided, these etchant conduits being especially designed to facilitate fluid flow from closed end 32 to open end 34 of valley 22 and thereby substantially eliminate any dead spots in fluid flow during the etching operation.

For this purpose, in accordance with the present invention, a number of inclined etchant conduits 38 are provided, these inclined etchant conduits being so arranged that their center lines 40 define with the plane 42 of the metal layer to be etched an acute angle alpha. As shown in FIG. 2, the acute angle alpha of each of the inclined etchant conduits increase from the inclined conduit located adjacent the closed end of the valley to the inclined conduit located adjacent the open end. By this technique, the transverse motion imparted to the liquid etchant flowing through the inclined etchant conduits 38 is greater near the closed end 32 and decreases as the opened end 34 of the valley 22 is approached. If desired, vertical etchant conduits 44 and 46 can also be provided at the closed end and open ends, respectively.

In accordance with another example of this aspect of the invention, the diameters of the etchant conduits can also be varied so as to facilitate fluid flow from the closed end of the valley 22 to the opened end. This is also illustrated in FIG. 2 where it can be seen that the diameters of the etchant conduits decrease from vertical etchant conduit 44 through the inclined etchant conduits 38 to vertical etchant conduit 46 located at the open end of valley 22.

FIG. 3 illustrates still another example of this aspect of the invention. In FIG. 3, valley 22 is open at both ends. Accordingly, in this situation, a vertical etchant conduit 48 is provided at or near the center of valley 22 and a series of inclined etchant conduits 50, 52 and 54 are also provided. As shown in this Figure, the inclined etchant conduits are so arranged that etchant will be charged out of the first ends thereof in a direction towards the nearer of the open ends of the valley. Also, as in the case of FIG. 2, the angle alpha of inclination decreases as the open end is approached.

As can be appreciated from these figures, the size and arrangement of the etchant conduits can play a significant role in determining the uniformity of flow of etchant and other fluids. Accordingly, care should be taken when designing a particular mask head in accordance with the present invention to configure the etchant conduits to foster this uniform flow, if desired.

Figure 4:
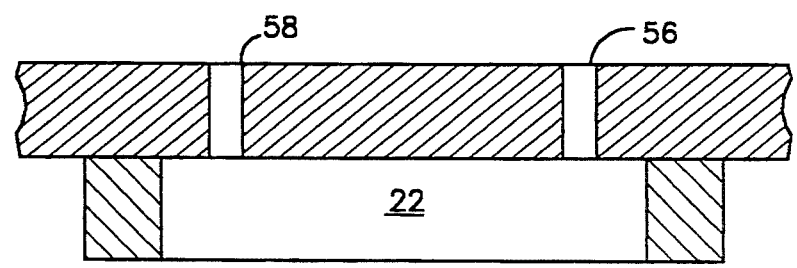
FIG. 4 is still another illustration similar to FIGS. 2 and 3 showing the arrangement of etchant conduits when the valley in the mask head is totally closed to the periphery of the substrate.

FIG. 4 illustrates still another embodiment of the invention, which is provided in the situation in which the valley 22 is totally closed. In this instance, one of the etchant conduits, in this case charging etchant conduit 56, is provided for charging etchant or other chemical into valley 22 while drain 58 is provided for removing etchant or other liquid from valley 22. A further discharge conduit (not shown) is connected to the second end of drain 52 to provide a pathway for removing etchant from the valley.

Figure 5:
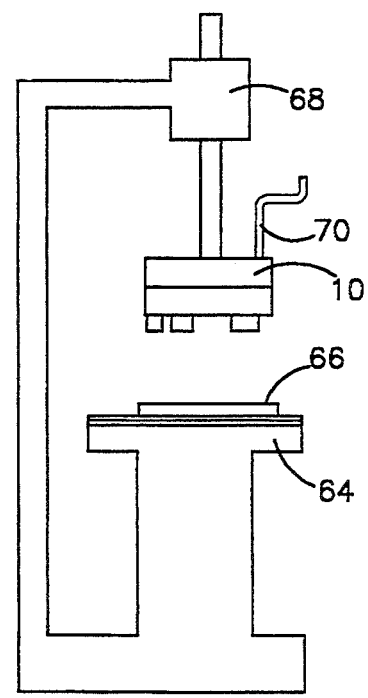
FIG. 5 is a schematic illustration of a machine useful for practicing the process of this invention using the mask heads illustrated in FIGS. 2 to 4.

In accordance with still another embodiment of the invention, a novel machine is provided for forming predetermined electrical circuitry patterns or features on dielectric substrates. This machine, which is schematically illustrated in FIG. 5, is composed of mask head 10 illustrated in FIGS. 1 to 4, a support 64 for carrying the substrate 66 to be processed, a device 68 for moving the mask head into and out of contact with the substrate and for causing the mask head to be pressed against the substrate with a suitable pressure (for example a mechanical gear box or a hydraulic mechanism) and finally supply means 70 such as a supply conduit attached to a reservoir and pump (not shown), to supply etchant and other chemicals to the mask head. All of these elements are well known in the art and are conventional.

Although only a single embodiment of the invention has been described above, many modifications can be made without department from the spirit and scope of the invention. For example, although the figures illustrate etchant conduits arranged in a single row, these conduits can be arranged in any pattern which promotes uniform flow. For example, two or more etchant conduits can be arranged in tandem in wider valleys, while other arrangements for the conduits such as a herring bone or staggered arrangement can also be used. All such modifications are intended to be included within the scope of the invention, which is to be limited only by the following claims:

We claim:

1. A process for forming an electrical circuitry pattern or discrete features on a dielectric substrate, said electrical circuitry pattern or features, being composed of discrete, electrically conducting metal pathways and non-conducting spaces therebetween, said process comprising
   (a) depositing a continuous layer of an electrically conducting metal on a surface of said substrate,
   (b) contacting said metal layer with a mask head defining a system of ridges and valleys therein, said ridges sealing the portions of said metal layer corresponding to said pathways from liquid contact and said valleys exposing the portions of said metal layer corresponding to said spaces, said ridges being formed from a flexible material having a durometer hardness of 40 A to 90 A, and (c) contacting the portions of said metal layer exposed by said valleys with an etchant to remove said exposed portions and thereby form said electrical circuitry pattern.

2. The process of claim 1 wherein said material has a durometer hardness of from 50 A to 60 A.

3. The process of claim 1 wherein said ridges are made from a synthetic rubber.

4. The process of claim 3 wherein said ridges are made from EPDM rubber.

5. The process of claim 3 wherein said mask head contacts said metal layer with a pressure of 2 to 20 pounds per square inch.

6. The process of claim 1 wherein said dielectric material is ceramic, said metal is copper and said pressure is 5 to 15 pounds per square inch.

7. The process of claim 6 wherein said metal layer is composed of a first layer of chromium deposited on said surface, a layer of copper deposited on said chromium layer, and a second layer of chromium deposited on said copper layer.

8. A process for forming an electrical circuitry pattern or discrete features on a dielectric substrate, said electrical circuitry pattern or features being composed of discrete, electrically conducting metal pathways and non-conducting spaces therebetween, said process comprising (a) depositing a continuous layer of an electrically conducting metal on a surface of said substrate, (b) contacting said metal layer with a mask head defining a system of ridges and valleys therein, said ridges sealing the portions of said metal layer corresponding to said pathways from liquid contact and said valleys exposing the portions of said metal layer corresponding to said spaces, said mask head further defining a manifold for supplying said etchant to said metal layer, said mask head also defining at least one etchant conduit terminating in one of said valleys for supplying etchant to said metal layer, the other end of said etchant conduit terminating in said manifold, and (c) supplying etchant to said metal layer by charging etchant from said manifold through said at least one etchant conduit to thereby contact the portions of said metal layer exposed by said valleys with said etchant to remove said exposed portions and thereby form said electrical circuitry pattern.

9. The process of claim 8 wherein said mask head defines a plurality of etchant conduits.

10. The process of claim 9 wherein said mask head further comprises a backing plate, and further wherein said ridges are formed from sections of synthetic rubber mounted on said backing plate so that said backing plate separates said manifold from said ridges, at least some of said etchant conduits being formed in said backing plate so that the first ends thereof terminate in said valleys and the other ends thereof terminate in said manifold.

11. The process of claim 8 wherein said mask head defines a plurality of etchant conduits, the central axes of at least some of said etchant conduits being inclined at acute angles with respect to the plane of said metal layer so that discharge of etchant from said etchant conduits provides said etchant with a transverse direction of motion across the surface of said metal layer.

12. The process of claim 11 where at least one valley in said mask head is a partially-closed valley, said partially-closed valley defining an open end open to the periphery of said substrate, a closed end opposite said open end and sides extending between said open end and said closed end, said sides and said closed end being closed to the periphery of said substrate, the central axes of the etchant conduits terminating is said partially-closed valley being inclined so that said transverse direction of motion is towards the opened of said partially-closed valley.

13. The process of claim 12 wherein the acute angles defined by the intersection of the plane of said metal layer with the central axes of respective conduits increase from the conduit located adjacent the closed end of said valley to the conduit located adjacent the open end of said valley so that the extent of transverse motion provided to the etchant by the discharge thereof from said conduits decreases from the closed end of said valley to the open end of said valley.

14. The process of claim 13 wherein the diameters of the conduits in said partially-closed valley decrease from the conduit located adjacent the closed end of said valley to the conduit located adjacent the open end of said valley so that the mass flow rate of etchant discharged from said conduits decreases from the closed end to the open end of said partially-closed valley.

15. The process of claim 13 wherein said mask head further defines a terminal etchant conduit proximate the closed end of said valley and an entry etchant conduit proximate the open end of said valley, the central axes of said entry and terminal conduits being essentially perpendicular to the plane of said substrate-engaging face.

16. The process of claim 11 wherein at least one valley in said mask head is elongated and defines two open ends open to the periphery of said substrate and sides extending between said two open ends, said mask head defining a plurality of etchant conduits terminating in said valley, said etchant conduits being inclined at acute angles such that the direction of flow of etchant passing out of said etchant conduits is towards the nearer open end of said valley.

17. The process of claim 8 wherein at least one of said valleys is closed to the periphery of said substrate, said mask head further defining a recovery conduit communicating with said closed valley for recovering etchant charged into said closed valley, said process further comprising withdrawing etchant supplied to said closed valley through said recovery conduit.

18. The process of claim 1 wherein said substrate defines two essentially parallel major surfaces, wherein a continuous metal layer is deposited on both major surfaces, and wherein separate predetermined electrical circuitry patterns are formed on both major surfaces by steps (2) and (3) of the process of claim 1.

19. A process for selectively removing portions of a continuous metal layer carried on at least one surface of a dielectric substrate to thereby form an electrical circuitry pattern or discrete feature on said surface, said electrical circuitry pattern being composed of discrete electrically conducting metal pathways and non-conducting spaces therebetween, said process comprising (1) contacting said metal layer with a mask head defining a system of ridges and valleys therein, said ridges sealing the portions of said metal layer corresponding to said pathways and said valleys exposing the position of said metal layer corresponding to said spaces, said ridges being formed from a flexible material having a durometer hardness of 40 A to 90 A, and (2) contacting the exposed portion of said metal layer with an etchant to remove said exposed portions and thereby form said electrical circuitry pattern.

20. A mask head for forming an electrical circuitry pattern or discrete features on a dielectric substrate, said electrical circuitry pattern being composed of discrete electrically conducting metal pathways and non-conducting spaces therebetween, said mask head comprising a body defining a system of ridges and valleys therebetween, said ridges corresponding to said Pathways and said valleys corresponding to said spaces, said ridges being formed from a material capable of sealing portions of a metal layer carried on said dielectric substrate from liquid contact when said mask head is pressed onto said metal layer with a pressure of 2 to 20 pounds per square inch, said material also having a durometer hardness of 50 A to 90 A, said ridges together defining a substrate-engaging face, said body further defining at least one etchant conduit passing therethrough and having a first end terminating in one of said valleys for supplying etchant thereto at said substrate-engaging face for supplying etchant to at least one of said valleys.

21. The mask head of claim 20 wherein said mask head defines a plurality of etchant conduits, the central axes of at least some of said etchant conduits being inclined at acute angles with respect to the plane of said substrate-engaging face.

22. The mask head of claim 21 wherein said mask head further defines a manifold for supplying said etchant to said metal layer, the other ends of said etchant conduit terminating in said manifold.

23. The mask head of claim 22 wherein said mask head includes a backing plate, said ridges being formed from sections of synthetic rubber mounted on said backing plate so that said mounting plate separates said manifold from said ridges, at least some of said etchant conduits being formed in said backing plate so that the first ends thereof terminate in said valleys and the other ends thereof terminate in said manifold.

24. The mask head of claim 20 wherein said ridges are formed from synthetic rubber having a durometer hardness of 50 to 60.

25. A machine for selectively recovering portions of continuous metal layer carried on at least one surface of a dielectric substrate to thereby form a predetermined electrical circuitry pattern on said surface, said predetermined electrical circuitry pattern being composed of discrete electrically conducting metal pathways and non-conducting spaces therebetween, said machine comprising (1) a support carrying said substrate,
(2) the mask head of claim 22 arranged to contact said substrate when carried on said support,
(3) a device for moving said mask head into contact with said substrate and for causing said mask head to be pressed against said substrate with a pressure of 2 to 20 lbs. per square inch, and
(4) means to supply an etchant to at least one etchant conduit in said mask head while said mask head is in contact with said substrate.

* * * * *